United States Patent
Na et al.

(10) Patent No.: US 12,324,323 B2
(45) Date of Patent: *Jun. 3, 2025

(54) LIGHT-EMITTING DISPLAY APPARATUS

(71) Applicant: LG Display Co., Ltd., Seoul (KR)

(72) Inventors: Hyunseok Na, Gyeonggi-do (KR);
Sanggil Kim, Gyeonggi-do (KR);
JaeJun Ahn, Gumi-si (KR);
Hyoungsun Park, Seoul (KR);
ChangSuk Hyun, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/630,551

(22) Filed: Apr. 9, 2024

(65) Prior Publication Data

US 2024/0268162 A1 Aug. 8, 2024

Related U.S. Application Data

(63) Continuation of application No. 18/146,029, filed on Dec. 23, 2022, now Pat. No. 11,980,066.

(30) Foreign Application Priority Data

Feb. 28, 2022 (KR) .......................... 10-2022-0025905

(51) Int. Cl.
*G06F 3/041* (2006.01)
*G06F 3/044* (2006.01)
(Continued)

(52) U.S. Cl.
CPC ......... *H10K 59/126* (2023.02); *G06F 3/0412* (2013.01); *G06F 3/0443* (2019.05); *H10K 50/844* (2023.02); *H10K 59/1213* (2023.02); *H10K 59/1216* (2023.02); *H10K 59/40* (2023.02); *H10D 30/6731* (2025.01);
(Continued)

(58) Field of Classification Search
CPC ... G06F 3/0443; G06F 3/0412; H01L 27/126; H10K 59/40

See application file for complete search history.

(56) References Cited

U.S. PATENT DOCUMENTS 11,980,066 B2 * 5/2024 Na .......................... G06F 3/0443
2017/0162606 A1 6/2017 Yan et al.
(Continued)

FOREIGN PATENT DOCUMENTS

EP 4156274 A1 3/2023

*Primary Examiner* — Kevin M Nguyen
(74) *Attorney, Agent, or Firm* — Seed IP Law Group LLP

(57) ABSTRACT

The present disclosure provides a light-emitting display apparatus including a substrate including a first region and a second region, a first thin-film transistor (TFT) disposed in the first region of the substrate and including a first semiconductor pattern, a first gate electrode, a first source electrode, and a first drain electrode, a second TFT disposed in the second region of the substrate and including a second semiconductor pattern, a second gate electrode, a second source electrode, and a second drain electrode, at least one insulating layer between the first semiconductor pattern and the second semiconductor pattern, a first blocking layer below the first semiconductor pattern, and a second blocking layer below the second semiconductor pattern.

18 Claims, 10 Drawing Sheets

(51) Int. Cl.
  *H10K 50/844* (2023.01)
  *H10K 59/121* (2023.01)
  *H10K 59/126* (2023.01)
  *H10K 59/40* (2023.01)
  *H10D 30/67* (2025.01)
  *H10D 86/40* (2025.01)
  *H10D 86/60* (2025.01)

(52) U.S. Cl.
  CPC ..... *H10D 30/6745* (2025.01); *H10D 30/6755* (2025.01); *H10D 86/423* (2025.01); *H10D 86/471* (2025.01); *H10D 86/481* (2025.01); *H10D 86/60* (2025.01)

(56) References Cited

U.S. PATENT DOCUMENTS

| | | |
|---|---|---|
| 2017/0294456 A1 | 10/2017 | Lee et al. |
| 2017/0338252 A1 | 11/2017 | Lee et al. |
| 2019/0207039 A1 | 7/2019 | Yao et al. |
| 2019/0237533 A1 | 8/2019 | Kim et al. |
| 2019/0348449 A1 | 11/2019 | Gui et al. |
| 2020/0004381 A1* | 1/2020 | Han ................. H10K 59/40 |
| 2020/0083309 A1 | 3/2020 | Wang et al. |
| 2020/0111433 A1 | 4/2020 | Kikuchi et al. |
| 2020/0227500 A1 | 7/2020 | Chen et al. |
| 2021/0036029 A1 | 2/2021 | Park et al. |
| 2023/0065335 A1 | 3/2023 | Kim et al. |

\* cited by examiner

LIGHT-EMITTING DISPLAY APPARATUS

CROSS REFERENCE TO RELATED APPLICATION

This application claims priority from Korean Patent Application No. 10-2022-0025905, filed on Feb. 28, 2022, which is hereby incorporated by reference for all purposes as if fully set forth herein.

BACKGROUND

Technical Field

The present disclosure relates to a light-emitting display apparatus, and more particularly, to a light-emitting display apparatus including a plurality of thin-film transistors (TFTs) for simplifying a process and improving driving stability of the light-emitting display apparatus.

Description of the Related Art

Recently, display devices capable of displaying various types of information while interacting with users who are watching the information have various sizes and forms with various functions.

Examples of such a display device include a liquid crystal display (LCD) device, an electrophoretic display device (FPD), a light-emitting diode (LED) display device, etc.

An LED display device is a self-emitting display device that, unlike an LCD device, does not need a light source and thus can be manufactured in a lightweight and thin form. The LED display device is being studied as a next-generation display, because it can be driven with a low voltage and thus is advantageous in power consumption and is excellent in terms of color implementation, a response rate, a viewing angle, and a contrast ratio (CR).

When an LED display device is an organic LED (OLED) display device, a light-emitting element layer may be an organic light-emitting element layer that includes an anode electrode, an emission layer, and a cathode electrode. In addition, a quantum dot LED (QLED) including quantum dots (QD) as a light-emitting element layer may be used. Although it is assumed herein that an LED display device is an OLED display device, the type of a light-emitting element layer is not limited thereto.

An OLED display device displays information on a screen by a plurality of pixels each including a light-emitting element layer with an emission layer emitting light, and may be classified as an active matrix type OLED display (AMOLED) or a passive matrix type OLED display (PMOLED) according to a method of driving pixels.

An AMOLED displays an image by controlling current flowing through an OLED using a thin-film transistor (TFT).

An AMOLED may include various types of TFTs, including a switching TFT, a driving TFT connected to the switching TFT, and an OLED connected to the driving TFT.

A plurality of driving circuits for controlling an operation of a light-emitting element layer may be disposed in a display area of a substrate. The light-emitting element layer may be electrically connected to a driving circuit. The driving circuit may supply a driving current corresponding to a data signal to the light-emitting element layer according to a scan signal. A pixel driving circuit may include a plurality of TFTs and a storage capacitor.

The plurality of TFTs may include TFTs that are in the form of different types of semiconductor patterns or in a hybrid form.

BRIEF SUMMARY

The inventors have realized that, due to the use of the different types of semiconductor patterns, e.g., a polycrystalline semiconductor pattern formed of a low-temperature poly-silicon (LTPS) material and an oxide semiconductor pattern formed of an oxide, a process of manufacturing a TFT including the polycrystalline semiconductor pattern and a process of manufacturing a TFT using an oxide semiconductor pattern should be performed separately, thus increasing the number of processes and making the processes complicated. The polycrystalline semiconductor pattern and the oxide semiconductor pattern exhibit different characteristics with respect to a chemical gas, thus making the processes more complicated.

When an OLED display device is applied as an LED display device for a smart watch on which a large number of still images are displayed or the like, leakage current may occur when still images are displayed, thus increasing power consumption. Accordingly, methods of simplifying a manufacturing process of an LED display device and improving the stability of TFTs of an LED display device are being studied in various ways, but results are not satisfactory and thus development of such an LED display device is pressing.

The present disclosure is directed to providing a light-emitting display apparatus in which an insulating layer is provided between semiconductor patterns to protect the semiconductor patterns of different type thin-film transistors (TFTs).

The present disclosure is also directed to providing a light-emitting display apparatus in which an insulating layer is provided between semiconductor patterns of different types to protect the semiconductor patterns of different type TFTs and reduce the number of processes.

The present disclosure is also directed to providing a light-emitting display apparatus in which a gate electrode and source and drain electrodes of each of different TFTs are disposed on the same layer to reduce the number of processes and manufacturing costs.

The present disclosure is also directed to providing a light-emitting display apparatus including blocking layers below different TFTs to secure the stability of the TFTs when driven.

The present disclosure is also directed to providing a light-emitting display apparatus in which a distance to a blocking layer below a driving TFT including an oxide semiconductor pattern is set to be less than a distance to a blocking layer below another TFT to prevent screen blurring from occurring at low gradation.

A light-emitting display apparatus according to an embodiment of the present disclosure includes a substrate including a first region and a second region, a first TFT disposed in the first region of the substrate and including a first semiconductor pattern, a first gate electrode, a first source electrode, and a first drain electrode, a second TFT disposed in the second region of the substrate and including a second semiconductor pattern, a second gate electrode, a second source electrode, and a second drain electrode, at least one insulating layer between the first semiconductor pattern and the second semiconductor pattern, a first blocking layer below the first semiconductor pattern, and a second blocking layer below the second semiconductor pattern.

A light-emitting display apparatus according to another embodiment of the present disclosure includes a substrate including a first region and a second region, a first TFT disposed in the first region of the substrate and including a first semiconductor pattern, a first gate electrode, a first source electrode, and a first drain electrode, a second TFT disposed in the second region of the substrate and including a second semiconductor pattern, a second gate electrode, a second source electrode, and a second drain electrode, a first blocking layer below the first semiconductor pattern, and a second blocking layer below the second semiconductor pattern.

In a light-emitting display apparatus according to an embodiment of the present disclosure, an insulation layer is disposed between semiconductor patterns of different types of thin-film transistors (TFTs) to protect the semiconductor patterns and improve display quality and stability of the light-emitting display apparatus.

In a light-emitting display apparatus according to an embodiment of the present disclosure, different types of semiconductor patterns are disposed in contact with upper and lower sides of an insulating layer to protect a semiconductor pattern of each TFT during formation of another semiconductor pattern and reduce the number of processes.

In a light-emitting display apparatus according to an embodiment of the present disclosure, gate electrodes and source and drain electrodes of different types of TFTs are disposed on the same layer to reduce the number of processes and manufacturing costs.

In a light-emitting display apparatus according to an embodiment of the present disclosure, a blocking layer is disposed below different TFTs to secure the stability of the TFTs when driven, thereby improving display quality.

In a light-emitting display apparatus according to an embodiment of the present disclosure, a distance to a blocking layer below a driving TFT including an oxide semiconductor pattern is set to be less than a distance to a blocking layer below another TFT to reduce a variation in current in the driving TFT, thereby preventing screen blurring from occurring in the driving TFT at low gradation.

Effects of the present disclosure are not limited thereto and other effects that are not described here will be clearly understood by those of ordinary skill in the art from the following description.

BRIEF DESCRIPTION OF THE SEVERAL VIEWS OF THE DRAWINGS

The above and other aspects, features and advantages of the present disclosure will be more apparent from the following detailed description taken in conjunction with the accompanying drawings, in which.

DETAILED DESCRIPTION

Figure 1:
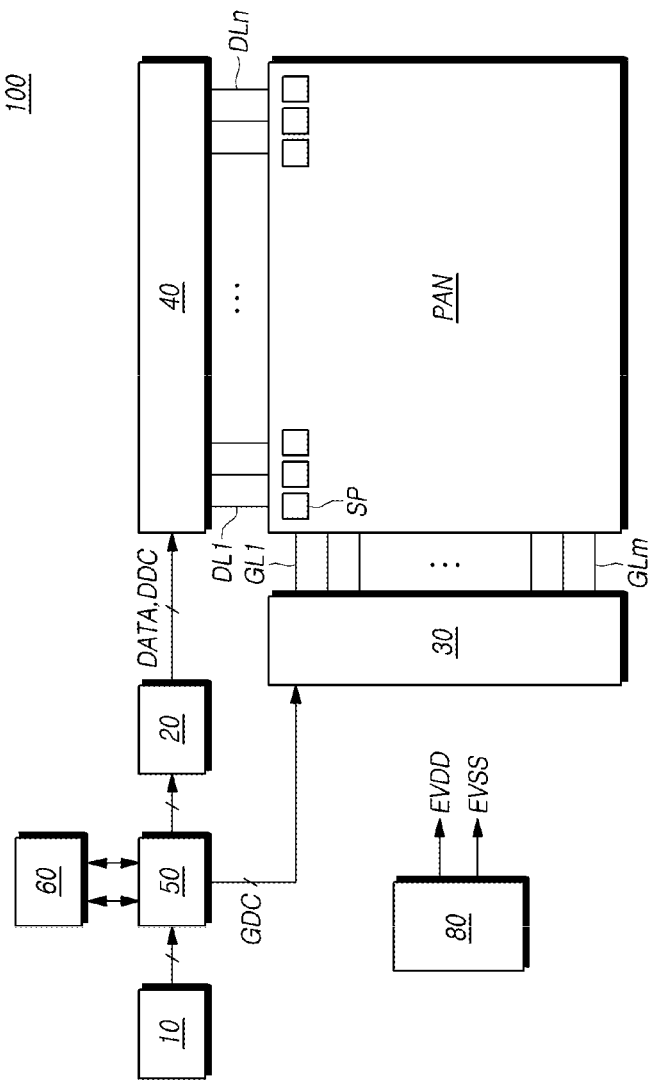
FIG. 1 is a block diagram of a light-emitting display apparatus according to an embodiment of the present disclosure.

Advantages and features of the present disclosure and methods of achieving them will be apparent from embodiments described in detail below, in conjunction with the accompanying drawings. However, the present disclosure is not limited to the embodiments set forth herein and may be embodied in many different forms. The embodiments are merely provided so that this disclosure will be thorough and complete and will fully convey the scope of the present disclosure to those of ordinary skill in the art.

Shapes, sizes, ratios, angles, numbers, etc., illustrated in the drawings to describe embodiments of the present disclosure are only examples and thus the present disclosure is not limited thereto. The same reference numerals refer to the same components throughout the specification. In the following description of the present disclosure, related well-known technologies are not described in detail when it is determined that they would obscure the subject matter of the present disclosure due to unnecessary detail. It will be understood that terms "comprise," "have," "include," etc., when used herein, include addition of other components unless "only" is used. As used herein, singular forms are intended to include plural forms as well, unless the context clearly indicates otherwise.

It will be understood that components can be interpreted as including an error range even when the content does not clearly indicate the error range.

When a positional relationship between two parts is described using, for example, "on," "above," "below," "beside," or the like, one or more other parts may be positioned between the two parts, unless "immediately" or "directly" is used.

When a temporal relationship, i.e., a temporarily contextual relationship, is described using "after," "subsequent to," "next," "before" or the like, such terms should be understood as including discontinuity, unless "immediately" or "directly" is used.

Although "first," "second," etc., are used herein to describe various components, the components are not limited by these terms. These terms are only used to distinguish one component from another. Therefore, a first component described below could be termed a second component without departing from the technical scope of the present disclosure.

Terms such as "first," "second," "A," "B," "(a)," and "(b)" may be used to describe components of the present disclosure. Such terms are only for distinguishing one component from another, and the essence, order, sequence, number or the like of the components is not limited by the terms. It should be understood that when a component is referred to as being "coupled to," "combined with" or "connected to" another component, the component may be directly coupled or connected to the other component or the component may be indirectly coupled or connected to the other component through another component interposed therebetween unless the context explicitly indicates otherwise.

The term "at least one" should be understood to include all of one or more combinations of components associated with each other. For example, "at least one of first, second, and third components" may be understood to include not only the first, second, or third component but also combinations of at least two of the first, second, and third components.

As used herein, the term "apparatus" may be understood to include a display device such as a liquid crystal module (LCM) or an organic light-emitting diode display (OLED) module that includes a display panel and a driver for driving the display panel. The term "apparatus" may be understood to further include a set electronic apparatus or a set device or apparatus, e.g., a laptop computer, a television, or a computer monitor, which is a complete product or final product that includes an LCM, an OLED module or the like, an equipment apparatus including a vehicle or automotive apparatus or another form of a vehicle, a mobile electronic apparatus such as a smart phone or an electronic pad.

Therefore, an apparatus described herein may be understood to be a display device such as an LCM or an OLED module, or an application product or a set device (which is final consumer device) that includes an LCM or an OLED module.

In some embodiments, an LCM or an OLED module including a display panel, a driver, etc., may be referred to as a "display device," and an electronic device, which is a complete product including an LCM or an OLED module, may be referred to as a "set device." For example, the display device may include a display panel such as a liquid crystal display (LCD) or an OLED, and a source printed circuit board (PCB), which is a controller for driving the display panel. The set device may further include a set PCB, which is a set controller electrically connected to the source PCB to drive the entire set device.

The term "display panel," when used in embodiments of the present disclosure, may be understood to include various forms of display panels such as a liquid crystal display panel, an OLED display panel, and an electroluminescent display panel, but embodiments are not limited thereto. For example, a display panel may be a display panel that generates sound when vibrated by a vibration device according to an embodiment of the present disclosure. A form or size of a display panel applied to a display device according to an embodiment of the present disclosure is not limited.

Features of various embodiments of the present disclosure may be partially or entirely combined with each other or be implemented technically in association with each other in various ways, and the embodiments may be implemented independently or together with each other.

Hereinafter, embodiments of the present disclosure will be described with respect to the accompanying drawings and embodiments set forth herein. The scale of components shown in the drawings may be exaggerated for convenience of description and thus embodiments are not limited thereto.

Hereinafter, various embodiments of the present disclosure will be described in detail with reference to the accompanying drawings.

FIG. 1 is a block diagram of a light-emitting display apparatus according to an embodiment of the present disclosure.

Referring to FIG. 1, a light-emitting display apparatus 100 according to an embodiment of the present disclosure includes a display panel PAN, an image processor 10 for transmitting a signal to the display panel PAN, a degradation compensator 50, a memory 60, a timing controller 20, a data driver 40, a power supply 80, and a gate driver 30.

The image processor 10 outputs a driving signal for driving various devices, as well as image data supplied from the outside. Examples of the driving signal output from the image processor 10 may include a data enable signal, a vertical synchronization signal, a horizontal synchronization signal, a clock signal, etc.

The degradation compensator 50 may calculate a degradation compensation gain value of a sub-pixel SP of the display panel on the basis of a sensing voltage Vsen applied from the data driver 40, calculate a dimming weight on the basis of the degradation compensation gain value, modulate input image data Idata of each sub-pixel SP of a current frame according to the degradation compensation gain value and the dimming weight, and supply modulated image data Mdata to the timing controller 20.

The timing controller 20 may receive a driving signal and the like, as well as the modified image data from the degradation compensator 50. The timing controller 20 may generate and output a gate timing control signal GDC for controlling operation timing of the gate driver 30 and a data timing control signal DDC for controlling operation timing of the data driver 40, based on a driving signal input from the image processor 10.

The timing controller 20 may obtain at least one sensing voltage Vsen from each sub-pixel SP by controlling the operation timings of the gate driver 30 and the data driver 40, and apply the at least one sensing voltage Vsen to the degradation compensator 50.

The gate driver 30 may output a scan signal to the display panel PAN in response to the gate timing control signal GDC supplied from the timing controller 20. The gate driver 30 may output the scan signal through a plurality of gate lines GL1 to GLm. The gate driver 30 may be provided in the form of an integrated circuit (IC) but is not limited thereto. The gate driver 30 may be provided in a gate-in panel (GIP) structure formed by directly stacking a TFT on a substrate of the light-emitting display apparatus 100. The GIP structure may include a plurality of circuits such as a shift register and a level shifter.

The data driver 40 may output a data voltage to the display panel PAN in response to the data timing control signal DDC input from the timing controller 20. The data driver 40 may sample and latch a data signal DATA, which is in a digital form, supplied from the timing controller 20 to convert the data signal DATA into a data voltage, which is in an analog form, based on a gamma voltage. The data driver 40 may output the data voltage through a plurality of data lines DL1 to DLn.

The data driver 40 may apply a sensing voltage Vsen, which is input from the display panel PAN through a sensing voltage lead-out line, to the degradation compensator 50. The data driver 40 may be mounted in the form of an integrated circuit (IC) on the display panel PAN or directly stacked on the display panel PAN together with various patterns, but embodiments are not limited thereto.

The memory 60 may store not only a look-up table of degradation compensation gains but also degradation compensation time of a light-emitting element layer of each sub-pixel SP. The degradation compensation time of the light-emitting element layer may be understood as the number of times that or a time duration for which the light-emitting display apparatus 100 is driven.

The power supply 80 may output a high-potential driving voltage EVDD and a low-potential driving voltage EVSS and apply them to the display panel PAN. The high-potential driving voltage EVDD and the low-potential driving voltage EVSS may be supplied to the display panel PAN through a power line. A voltage output from the power supply 80 may be output to the gate driver 30 or the data driver 40 to be used for driving the gate driver 30 or the data driver 40.

Figure 2:
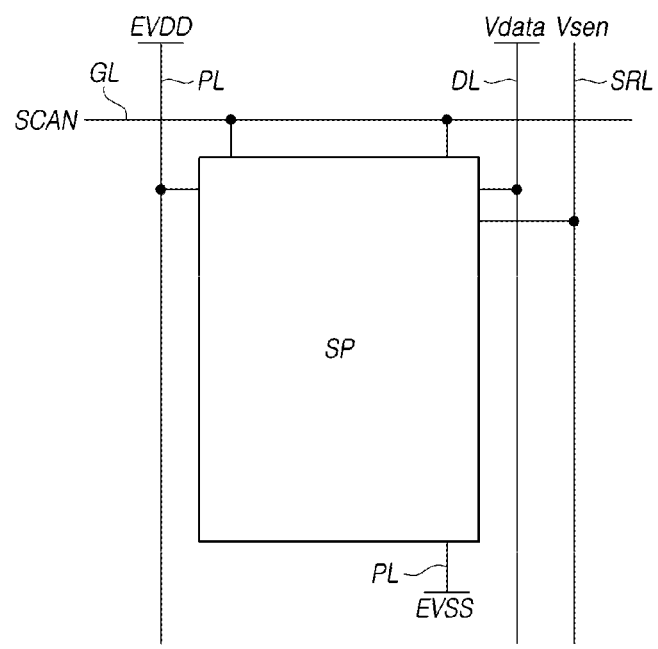
FIG. 2 is a schematic block diagram of a sub-pixel of a light-emitting display apparatus according to an embodiment of the present disclosure.
Figure 3:
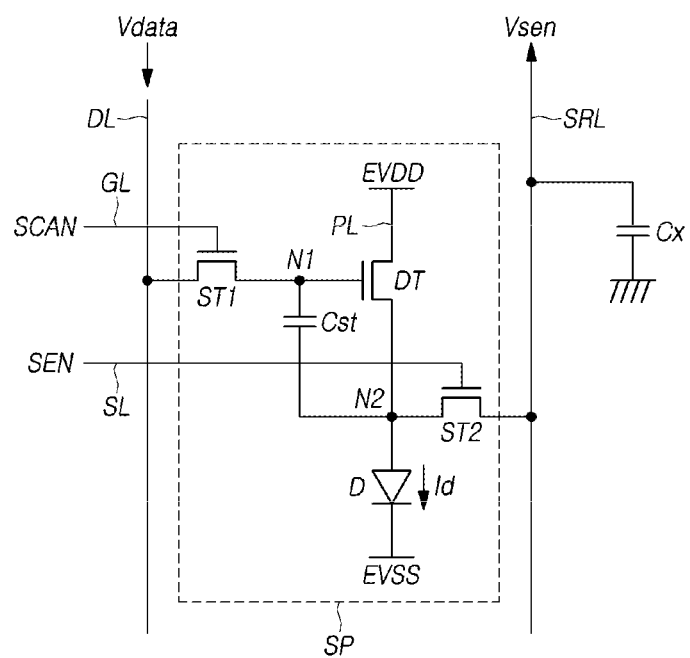
FIG. 3 is a circuit diagram of a sub-pixel of a light-emitting display apparatus according to an embodiment of the present disclosure.

FIG. 2 is a schematic block diagram of a sub-pixel of a light-emitting display apparatus according to an embodiment of the present disclosure. FIG. 3 is a circuit diagram of a sub-pixel of a light-emitting display apparatus according to an embodiment of the present disclosure.

Although FIG. 3 illustrates, as an example, a light-emitting display apparatus having a 3T1C structure including three TFTs and one storage capacitor, a light-emitting display apparatus of the present disclosure is not limited thereto and is applicable to various structures such as a 4T1C structure, a 5T1C structure, a 6T1C structure, a 7T1C structure, an 8T1C structure, a 4T2C structure, a 5T2C structure, a 6T2C structure, a 7T2C structure, and an 8T2C structure.

Referring to FIGS. 2 and 3, a light-emitting display apparatus 100 according to an embodiment of the present disclosure includes a gate line GL, a data line DL, a power line PL, and a sensing line SL, and each sub-pixel SP includes a first switching TFT ST1, a second switching TFT ST2, a driving TFT DT, an organic light-emitting element D, and a storage capacitor Cst.

The organic light-emitting element D includes an anode electrode connected to a second node N2, a cathode electrode connected to an input terminal of a low-potential driving voltage EVSS, and a light-emitting element layer between the anode electrode and the cathode electrode.

The driving TFT DT may control a current $I_d$ flowing through the organic light-emitting element D according to a gate-source voltage Vgs. The driving TFT DT may include a gate electrode connected to a first node N1, a drain electrode which is connected to the power line PL and to which a high-potential driving voltage EVDD is applied, and a source electrode connected to the second node N2.

The storage capacitor Cst is connected between the first node N1 and the second node N2. The storage capacitor Cst may maintain a certain voltage for one frame.

The first switching TFT ST1 applies a data voltage Vdata charged in the data line DL to the first node N1 to turn on the driving TFT DT, in response to a gate signal SCAN when the display panel PAN is driven. In this case, the first switching TFT ST1 may include a gate electrode which is connected to the gate line GL and to which the gate signal SCAN is input, a drain electrode which is connected to the data line DL and to which the data voltage Vdata is input, and a source electrode connected to the first node N1.

The second switching TFT ST2 switches a current between the second node N2 and the sensing voltage lead-out line SRL to store a source voltage of the second node N2 in a sensing capacitor Cx of the sensing voltage lead-out lines SRL, in response to a sensing signal SEN. The second switching TFT ST2 switches a current between the second node N2 and the sensing voltage lead-out line SRL to reset a source voltage of the driving TFT DT to an initialization voltage Vpre, in response to the sensing signal SEN when the display panel PAN is driven. In this case, a gate electrode of the second switching TFT ST2 is connected to the sensing line SL, a drain electrode thereof is connected to the second node N2, and a source electrode thereof is connected to the sensing voltage lead-out line SRL.

Figure 4:
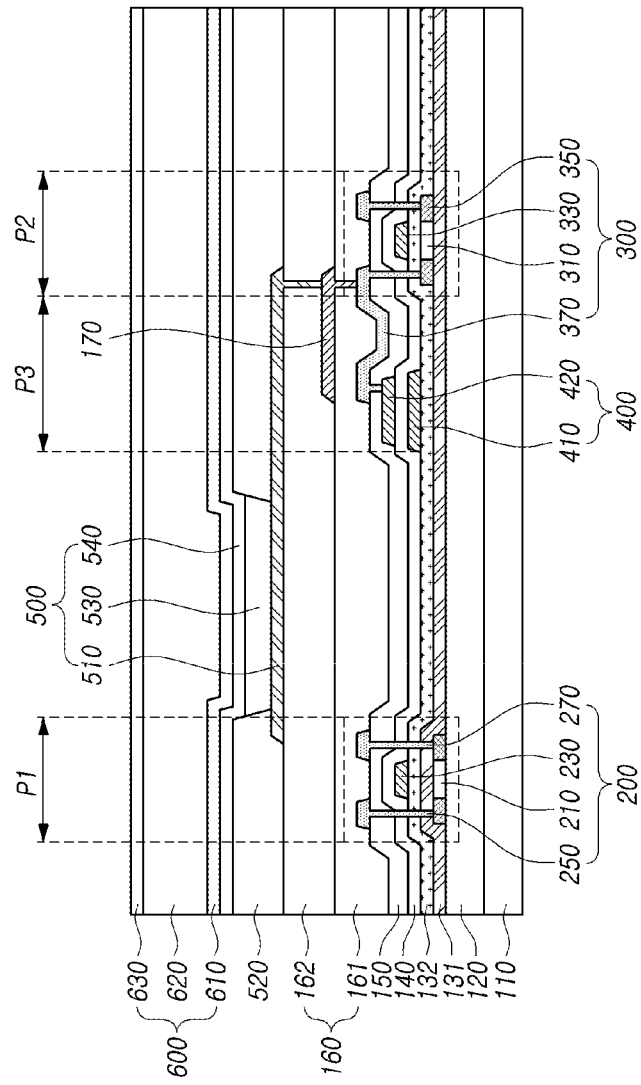
FIG. 4 is a cross-sectional view of a light-emitting display apparatus according to an embodiment of the present disclosure.

FIG. 4 is a cross-sectional view of a light-emitting display apparatus according to an embodiment of the present disclosure.

A light-emitting display apparatus 100 according to an embodiment of the present disclosure may include a substrate 110, a first semiconductor pattern 210, a second semiconductor pattern 310, and a first insulating layer 131.

On the substrate 110, a first TFT 200, a second TFT 300, and a storage capacitor 400 may be disposed in a first region P1, a second region P2, and a third region P3, respectively.

The first region P1, the second region P2, and the third region P3 may be different regions of the substrate 110. The first region P1, the second region P2, and the third region P3 may be provided in a display area or a non-display area. For example, the first TFT 200 may be disposed in the non-display area and the second TFT 300 may be disposed in the display area, but embodiments are not limited thereto.

Alternatively, the first region P1, the second region P2, and the third region P3 may be provided in the display area. For example, the first TFT 200, the second TFT 300, and the storage capacitor 400 may be disposed in a single sub-pixel SP. The first TFT 200 may be a switching TFT. The second TFT 300 may be a driving TFT.

The storage capacitor 400 may store a data voltage applied through a data line for a certain period and provide the data voltage to a light-emitting element layer 500.

The substrate 110 may support various components of a light-emitting display apparatus. The substrate 110 may be formed of a plastic material having flexibility (or compliance). For example, the substrate 110 may be formed of at least one of polyimide, polyether sulfone, polyethylene terephthalate and polycarbonate but is not limited thereto. When the substrate 110 is formed of the plastic material, a manufacturing process of the light-emitting display apparatus 100 may be performed in a state in which a support substrate formed of glass is disposed below the substrate 110, and the support substrate may be released after the manufacturing process is completed. In addition, a back plate (or a plate) may be disposed below the substrate 110 to support the substrate 110 after the releasing of the support substrate.

When the substrate 110 is formed of the plastic material, moisture may penetrate the substrate 110 and move to a TFT or a light-emitting element layer, thus deteriorating the performance of the light-emitting display apparatus 100. A light-emitting display apparatus according to an embodiment of the present disclosure may include two substrates formed of the plastic material to prevent deterioration of the performance of the light-emitting display apparatus due to moisture. In addition, an inorganic film may be formed between the two substrates to prevent the penetration of moisture into the two substrates, thereby improving the reliability of the performance of a product. The inorganic film may be provided in a single layer of silicon nitride (SiNx) or silicon oxide (SiOx) or multiple layers including both but is not limited thereto.

The substrate 110 may be understood as a concept including elements and functional layers formed thereon, e.g., a switching TFT, a driving TFT connected to the switching TFT, an organic light-emitting element connected to the driving TFT, a protective layer, etc., but is not limited thereto.

A buffer layer 120 may be disposed on all surfaces of the substrate 110. The buffer layer 120 may improve adhesion between layers on the buffer layer 120 and the substrate 110, and block various defects such as an alkaline components leaking from the substrate 110. In addition, the buffer layer 120 may delay the spread of moisture or oxygen penetrating the substrate 110.

The buffer layer 120 may include a single layer of silicon nitride (SiNx) or silicon oxide (SiOx) or multiple layers including both. When the buffer layer 120 includes multiple layers, silicon nitride (SiNx) and silicon oxide (SiOx) may be alternately formed.

The buffer layer 120 may be omitted on the basis of a type and material of the substrate 110, a structure and type of TFTs, and the like.

On the buffer layer 120, the first TFT 200 and the second TFT 300 may be disposed in the first region P1 and the second region P2, respectively.

In the first region P1, the first semiconductor pattern 210 of the first TFT 200 may be disposed on the buffer layer 120.

The first semiconductor pattern 210 may be formed of a polycrystalline semiconductor. For example, the polycrystalline semiconductor may be formed of low-temperature polysilicon (LTPS). When the first semiconductor pattern 210 is formed of the polycrystalline semiconductor, energy consumption is low and reliability is high.

In addition, the first semiconductor pattern 210 may be formed of amorphous silicon (a-SI) or various organic semiconductor materials such as pentacene. Alternatively, the first semiconductor pattern 210 may be formed of an oxide but is not limited thereto.

The first semiconductor pattern 210 may be formed by depositing an amorphous silicon (a-Si) material on the buffer layer 120, forming polysilicon by performing dehydrogenation, crystallization, activation, and hydrogenation, and patterning the polysilicon.

The first semiconductor pattern 210 may include a first channel region on which doping is not performed and in which a channel for movement of electrons or holes in the first semiconductor pattern 210 is formed when the first TFT 200 is driven. The first channel region may overlap a first gate electrode 230.

A first source region and a first drain region that are conductive regions formed by a doping process may be provided at both sides of the first channel region. The first source region is a part of the first semiconductor pattern 210 connected to the first source electrode 250, and the first drain region is a part of the first semiconductor pattern 210 connected to the first drain electrode 270.

The first source region and the first drain region may be formed by doping a polycrystalline silicon material with ions.

The first source region and the first drain region are conductive regions formed by injecting a Group III or V element into the polysilicon material. For example, the first source region and the first drain region may include phosphorus (P) or boron (B).

When a semiconductor pattern of a TFT is prepared using a polycrystalline semiconductor material, characteristics of the polycrystalline semiconductor material may decrease when there is a vacancy in the polycrystalline semiconductor material and thus heat treatment is performed to cause hydrogen contained in an insulating layer such as silicon nitride (SiNx) to be diffused into the polycrystalline semiconductor material, so that the vacancy in the polycrystalline semiconductor material may be filled with the hydrogen, thereby improving device characteristics of the semiconductor pattern. For example, many hydrogen particles may be contained in the insulation layer such as silicon nitride (SiNx) during a manufacturing process. When hydrogen contained in the insulating layer such as silicon nitride (SiNx) due to a heat treatment being performed is diffused into the first semiconductor pattern 210, which is a polycrystalline semiconductor pattern, by subsequent heat treatment, the vacancy in the polycrystalline semiconductor material may be filled with the hydrogen, thus improving device characteristics of the first semiconductor pattern 210. Thus, the first semiconductor pattern 210 may be stabilized. A first insulating layer 131 may be disposed on the first semiconductor pattern 210. The first insulating layer 131 may be disposed between the first semiconductor pattern 210 of the first TFT 200 and the second semiconductor pattern 310 of the second TFT 300 to insulate the first semiconductor pattern 210 and the second semiconductor pattern 310 from each other. The term "between" as used herein includes the meaning of between in the horizontal, vertical and/or diagonal directions. For example, the first insulating layer 131 in FIG. 4 has a portion that extends horizontally between the first semiconductor pattern 210 and the second semiconductor pattern 310, and may be said to be horizontally between the first and second semiconductor patterns 210. A lower surface of the first insulating layer 131 is adjacent the first semiconductor pattern 210, and an upper surface of the first insulating layer 131 is adjacent the second semiconductor pattern 310, such that the first insulating layer 131 may be said to be vertically between the first and second semiconductor patterns 210, 310. Although the upper surface of the first insulating layer 131 is shown in FIG. 4 to be coplanar with the upper surface of the first semiconductor pattern 210 in the region horizontally between the first and second semiconductor patterns 210, 310, the first insulating layer 131 may be thicker than the first semiconductor pattern 210 or thinner than the first semiconductor pattern 210 in some embodiments.

The first insulating layer 131 may be disposed between the first semiconductor pattern 210 and the first gate electrode 230 in the first region P1. The first insulating layer 131 may be disposed between the second semiconductor pattern 310 and the buffer layer 120 or the substrate 110 in the second region P2.

The first insulating layer 131 may be formed of an insulating inorganic material, such as silicon nitride (SiNx) or silicon oxide (SiOx), or an insulating organic material. The first insulating layer 131 may include holes for electrically connecting the first source electrode 250 and the first drain electrode 270 to the first semiconductor pattern 210.

The first insulating layer 131 includes an upper side and a lower side, the lower side of the first insulating layer 131 may be in contact with the first semiconductor pattern 210, and the upper side of the first insulating layer 131 may be in contact with the second semiconductor pattern 310. For example, the lower side of the first insulating layer 131 is in contact with an upper side of the first semiconductor pattern 210 and the upper surface of the first insulating layer 131 may be in contact with a lower side of the second semiconductor pattern 310. Although it is illustrated in the present specification that one insulating layer is disposed between the first semiconductor pattern 210 and the second semiconductor pattern 310, embodiments are not limited thereto and at least one insulating layer may be provided.

By disposing the first insulating layer 131 between the first semiconductor pattern 210 and the second semiconductor pattern 310, even when different types of semiconductor patterns described below are disposed, the semiconductor patterns may be protected in processes beneficial to form the semiconductor patterns, thereby improving the display quality and stability of the light-emitting display apparatus.

The second semiconductor pattern 310 of the second TFT 300 may be disposed on the first insulating layer 131 in the second region P2.

The second semiconductor pattern 310 may be formed of an oxide semiconductor. When a polycrystalline semiconductor pattern appropriate for high-speed operations is used as a semiconductor pattern of a driving TFT, leakage current may be generated in an off-state, thus increasing power consumption. Therefore, a semiconductor pattern may be formed of an oxide contributing to blocking leakage current.

Because the oxide semiconductor material has a larger band gap than a silicon semiconductor material, electrons cannot pass or have difficulty passing the band gap in the off-state, thus reducing an off-current.

The off-current is a leakage current between a source electrode and a drain electrode of a TFT that is in the off-state. When a driving TFT is formed of an oxide semiconductor material having a low off-current, an effect of blocking leakage current is high even when the off-state is maintained for a long time, thus minimizing a luminance change of the pixels when the driving TFT is driven at a low speed. In addition, the leakage current is low in the off-state, thus reducing power consumption.

The second semiconductor pattern 310 may be formed of a metal oxide, e.g., indium-gallium-zinc-oxide (IGZO), indium-zinc-oxide (IZO), indium-gallium-tin-oxide (IGTO) or indium-gallium-oxide (IGO) but embodiments are not limited thereto.

A conductive property of the metal oxide material may be improved by a doping process of injecting impurities.

The second semiconductor pattern 310 may include a second channel region on which doping is not performed and in which a channel for movement of electrons or holes in the second semiconductor pattern 310 is formed when the second TFT 300 is driven. The second channel region may overlap a second gate electrode 330.

A second source region and a second drain region that are conductive regions formed by doping process may be provided at both sides of the second channel region. The second source region is a part of the second semiconductor pattern 310 connected to the second source electrode 350, and the second drain region is a part of the second semiconductor pattern 310 connected to the second drain electrode 370.

The second source region and the second drain region may be formed by a doping process of injecting a Group III element such as boron into the metal oxide material.

A second insulating layer 132 may be disposed on the second semiconductor pattern 310. The second insulating layer 132 may be disposed between the first semiconductor patterns 210 and the first gate electrodes 230 and between the second semiconductor patterns 310 and the second gate electrodes 330. For example, the second insulating layer 132 may be disposed between the first semiconductor pattern 210 and the first gate electrode 230 in the first region P1. The second insulating layer 132 may be disposed between the second semiconductor pattern 310 and the second gate electrode 330 in the second region P2.

The second insulating layer 132 may be disposed between the first semiconductor pattern 210 and the first gate electrode 230 of the first TFT 200, and the first insulating layer 131 and the second insulating layer 132 may be disposed between the first semiconductor pattern 210 and the first gate electrode 230. The second insulating layer 132 may insulate the first semiconductor pattern 210 and the first gate electrode 230 from each other, together with the first insulating layer 131.

The second insulating layer 132 may be disposed between the second semiconductor pattern 310 and the second gate electrode 330 of the second TFT 300, and the second insulating layer 132 may be disposed between the second semiconductor pattern 310 and the second gate electrode 330. The second insulating layer 132 may insulate the second semiconductor pattern 310 and the second gate electrode 330 from each other.

The second insulating layer 132 may be formed of an insulating material, such as silicon nitride (SiNx) or silicon oxide (SiOx), or an insulating organic material.

The second insulating layer 132 may include holes for electrically connecting the first source electrode 250 and the first drain electrode 270 to the first semiconductor pattern 210. In addition, the second insulating layer 132 may include holes for electrically connecting the second source electrode 350 and the second drain electrode 370 to the second semiconductor pattern 310.

On the second insulating layer 132, the first gate electrode 230 may be disposed in the first region P1, the second gate electrode 330 may be disposed in the second region P2, and a first storage capacitor electrode 410 may be disposed in the third region P3.

The first gate electrode 230 may be disposed to overlap the first semiconductor pattern 210, and the second gate electrode 330 may be disposed to overlap the second semiconductor pattern 310.

The first gate electrode 230, the second gate electrode 330, and the first storage capacitor electrode 410 may each be provided in a single layer or multiple layers formed of one of molybdenum (Mo), copper (Cu), titanium (Ti), aluminum (Al), chromium (Cr), gold (Au), nickel (Ni), neodymium (Nd), tungsten (W), and gold (Au), or an alloy thereof, but embodiments are not limited thereto.

The number of insulating layers between the first gate electrode 230 and the first semiconductor pattern 210 of the first TFT 200 may be different from the number of insulating layers between the second gate electrode 330 and the second semiconductor pattern 310 of the second TFT 300.

The number of insulating layers between the first gate electrode 230 and the first semiconductor pattern 210 of the first TFT 200 may be greater than the number of insulating layers between the second gate electrode 330 and the second semiconductor pattern 310 of the second TFT 300. For example, at least two insulating layers may be disposed between the first gate electrode 230 and the first semiconductor pattern 210 of the first TFT 200. At least one insulation layer may be disposed between the second gate electrode 330 and the second semiconductor pattern 310 of the second TFT 300.

A first interlayer insulating layer 140 may be disposed on the first gate electrode 230, the second gate electrode 330, and the first storage capacitor electrode 410. The first interlayer insulating layer 140 may be formed of an insulating material, such as silicon nitride (SiNx) or silicon oxide (SiOx), or an insulating organic material.

The first interlayer insulating layer 140 may include holes for electrically connecting the first source electrode 250 and the first drain electrode 270 to the first semiconductor pattern 210. In addition, the first interlayer insulating layer 140 may include holes for electrically connecting the second source electrode 350 and the second drain electrode 370 to the second semiconductor pattern 310.

A second storage capacitor electrode 420 may be disposed on the first interlayer insulating layer 140 in the third region P3.

The second storage capacitor electrode 420 may be disposed to overlap the first storage capacitor electrode 410.

The second storage capacitor electrode 420 may be provided in a single layer or multiple layers formed of one of molybdenum (Mo), copper (CU), titanium (Ti), aluminum (Al), chromium (Cr), gold (Au), nickel (Ni), neodymium (Nd), tungsten (W), and gold (Au), or an alloy thereof but is not limited thereto.

The storage capacitor 400 may include two electrodes facing each other and a dielectric disposed between the two electrodes. The storage capacitor 400 may include the first storage capacitor electrode 410 and the second storage capacitor electrode 420. The first interlayer insulating layer 140 may be disposed between the first storage capacitor electrode 410 and the second storage capacitor electrode 420.

The second storage capacitor electrode 420 may be electrically connected to the light-emitting element layer 500 through the second drain electrode 370 or a connection electrode 170.

The second storage capacitor electrode 420 of the storage capacitor 400 may be electrically connected to the second drain electrode 370.

When the light-emitting display apparatus is driven by a signal applied through signal interconnections, a voltage of a TFT may distort. In this case, the storage capacitor 400 may be connected to the second TFT 300. Therefore, the storage capacitor 400 stores a data voltage applied through a data line for a certain period to prevent voltage distortion due to signal interconnections and stably operate a driving circuit when driven.

A second interlayer insulating layer 150 may be disposed on the second storage capacitor electrode 420.

The second interlayer insulating layer 150 may be formed of an insulating material, such as silicon nitride (SiNx) or silicon oxide (SiOx), or an insulating organic material.

The second interlayer insulating layer 150 may include holes for electrically connecting the first source electrode 250 and the first drain electrode 270 to the first semiconductor pattern 210. In addition, the second interlayer insulating layer 150 may include holes for electrically connecting the second source electrode 350 and the second drain electrode 370 to the second semiconductor pattern 310.

On the second interlayer insulating layer 150, the first source electrode 250 and the first drain electrode 270 may be disposed in the first region P1 and the second source electrode 350 and the second drain electrode 370 may be disposed in the second region P2.

The first source electrode 250 and the first drain electrode 270 in the first region P1 may be electrically connected to the first semiconductor pattern 210 through the holes in the first insulating layer 131, the second insulating layer 132, the first interlayer insulating layer 140, and the second interlayer insulating layer 150.

The second source electrode 350 and the second drain electrode 370 in the second region P2 may be electrically connected to the second semiconductor pattern 310 through the holes in the second insulating layer 132, the first interlayer insulating layer 140, and the second interlayer insulating layer 150.

The second drain electrode 370 may be electrically connected to the second storage capacitor electrode 420 through the hole in the second interlayer insulating layer 150.

The first source electrode 250, the first drain electrode 270, the second source electrode 350, and the second drain electrode 370 may each be provided in a single layer or multiple layers formed of one of molybdenum (Mo), copper (Cu), titanium (Ti), aluminum (Al), chromium (Cr), gold (Au), nickel (Ni), and neodymium (Nd), or an alloy thereof, but are not limited thereto. For example, the first source electrode 250, the first drain electrode 270, the second source electrode 350, and the second drain electrode 370 may each have a three-layer structure including conductive metal materials, e.g., titanium (Ti)/aluminum (Al)/titanium (Ti), but embodiments are not limited thereto.

A planarization layer 160 may be disposed on the first source electrode 250, the first drain electrode 270, the second source electrode 350, and the second drain electrode 370.

The planarization layer 160 may be disposed to cover the first TFT 200 and the second TFT 300. The planarization layer 160 may protect TFTs below the planarization layer 160 and decrease or planarize steps due to various patterns.

The planarization layer 160 may be formed of at least one material among organic insulating materials such as benzo cyclobutene (BCB), acrylic resin, epoxy resin, phenolic resin, polyamide resin, or polyimide resin but is not limited thereto. The planarization layer 160 may be disposed in a single layer or may be disposed in two or more layers in consideration of an arrangement of electrodes.

As the light-emitting display apparatus 100 has evolved to have high resolution, the number of various signal interconnections has increased. Accordingly, it is difficult for all of the signal interconnections to be disposed on a layer while securing a minimum or reduced distance therebetween, and thus an additional layer is provided. Due to the additional layer, an interconnection arrangement margin may be secured so that the wire/electrode layout may be easily designed. In addition, when a dielectric material is used to form a planarization layer in multiple layers, the planarization layer may be used to form a capacitance between metal layers.

When the planarization layer 160 is provided in two layers, the planarization layer 160 may include a first planarization layer 161 and a second planarization layer 162.

The connection electrode 170 may be disposed between the first planarization layer 161 and the second planarization layer 162.

A hole may be formed in the first planarization layer 161, the connection electrode 170 may be disposed in the hole, and the second TFT 300 and the light-emitting element layer 500 may be electrically connected through the connection electrode 170.

For example, one end (or part) of the connection electrode 170 may be connected to the second TFT 300 and another end (or another part) of the connection electrode 170 may be connected to the light-emitting element layer 500.

An anode electrode 510 may be disposed on the planarization layer 160. The anode electrode 510 may be electrically connected to the second drain electrode 370 through the hole in the planarization layer 160. Alternatively, the anode electrode 510 may be electrically connected to the second drain electrode 370 through the connection electrode 170.

The anode electrode 510 may supply holes to an emission layer 530 and be formed of a conductive material having a high work function.

When the light-emitting display apparatus 100 is a top emission type, the anode electrode 510 may be a reflective electrode that reflects light and be disposed using an opaque conductive material. For example, the anode electrode 510 may be formed of at least one of silver (Ag), aluminum (Al), gold (Au), molybdenum (Mo), tungsten (W), chromium (Cr), or an alloy thereof. For example, the anode electrode 510 may have a three-layer structure including silver (Ag)/ lead (Pd)/copper (Cu) but is not limited thereto.

A bank layer 520 may be disposed on the anode electrode 510 and the planarization layer 160. In the bank layer 520, a plurality of sub-pixels SP may be distinguished from each other, a blurring effect may be minimized or reduced, and mixture of colors relative to various viewing angles may be prevented.

The bank layer 520 may include a bank hole that exposes the anode electrode 510 corresponding to an emission area.

The bank layer 520 may be formed of, but is not limited to, at least one material among an inorganic insulating material such as silicon nitride (SiNx) or silicon oxide (SiOx) or an organic insulating material such as benzo cyclobutene (BCB), acrylic resin, epoxy resin, a phenolic resin, polyamide resin, or polyimide resin.

Spacers may be further disposed on the bank layer 520. The spacers may buffer empty spaces between the substrate 110 on which the light-emitting element layer 500 is formed and an upper substrate to minimize or reduce damage to the light-emitting display apparatus 100 due to external impacts. The spacers may be formed of the same material as the bank layer 520 and be formed simultaneously with the bank layer 520 but are not limited thereto.

The emission layer 530 may be disposed on the anode electrode 510 and the bank layer 520. The emission layer 530 may include a red organic emission layer, a green organic emission layer, a blue organic emission layer, or a white organic emission layer to emit light of a certain color. When the emission layer 530 includes a white organic emission layer, a color filter may be disposed on the light-emitting element layer 500 to convert white light from the white organic emission layer into light of a different color. In addition, the emission layer 530 may include a hole injection layer, a hole transport layer, an electron transport layer, an electron injection layer, and the like, as well as the organic emission layer, but embodiments are not limited thereto.

A cathode electrode 540 may be disposed on the emission layer 530. The cathode electrode 540 may supply electrons to the emission layer 530 and be formed of a conductive material having a low work function.

When the light-emitting display apparatus 100 is the top emission type, the cathode electrode 540 may be disposed using a transparent conductive material that transmits light. For example, the cathode electrode 540 may be formed of at least one of indium tin oxide (ITO) and indium zinc oxide (IZO) but is not limited thereto.

Alternatively, the cathode electrode 540 may be disposed using a semi-transparent conductive material that transmits light. For example, the cathode electrode 540 may be formed of at least one of alloys such as LiF/Al, CsF/Al, Mg:Ag, Ca/Ag, Ca:Ag, LiF/Mg:Ag, LiF/Ca/Ag, or LiF/Ca:Ag but is not limited thereto.

A protective layer 600 may be disposed on the cathode electrode 540 of the light-emitting element layer 500. The protective layer 600 may protect the light-emitting element layer 500 from external moisture, oxygen, or foreign substances. For example, the protective layer 600 may prevent the penetration of oxygen and moisture from the outside to prevent oxidation of a light-emitting material and an electrode material.

The protective layer 600 may be formed of a transparent material that transmits light emitted from the emission layer 530.

The protective layer 600 may include a first protective layer 610, a second protective layer 620, and a third protective layer 630 to block the penetration of moisture or oxygen. The first protective layer 610, the second protective layer 620, and the third protective layer 630 may be alternately stacked. The protective layer 600 may be formed of a transparent material that transmits light emitted from the emission layer 530.

The first protective layer 610 and the third protective layer 630 may be formed of at least one inorganic material among silicon nitride (SiNx), silicon oxide (SiOx), and aluminum oxide (AlyOz) but are not limited thereto. The first protective layer 610 and the third protective layer 630 may be formed using a vacuum film forming method such as chemical vapor deposition (CVD) or atomic layer deposition (ALD) but are not limited thereto.

The second protective layer 620 may cover foreign substances or particles that may be generated during the manufacturing process. In addition, the second protective layer 620 may planarize a surface of the first protective layer 610. For example, the second protective layer 620 may be a particle cover layer but is not limited thereto.

The second protective layer 620 may be a polymer based on an organic material such as silicon oxycarbide (SiOCz), epoxy, polyimide, polyethylene, or acrylate but is not limited to this.

The second protective layer 620 may be formed of a thermosetting material or photocurable material hardened by heat or light.

A light-emitting display apparatus including a touch sensor layer according to embodiments of the present disclosure will be described below.

Figure 5:
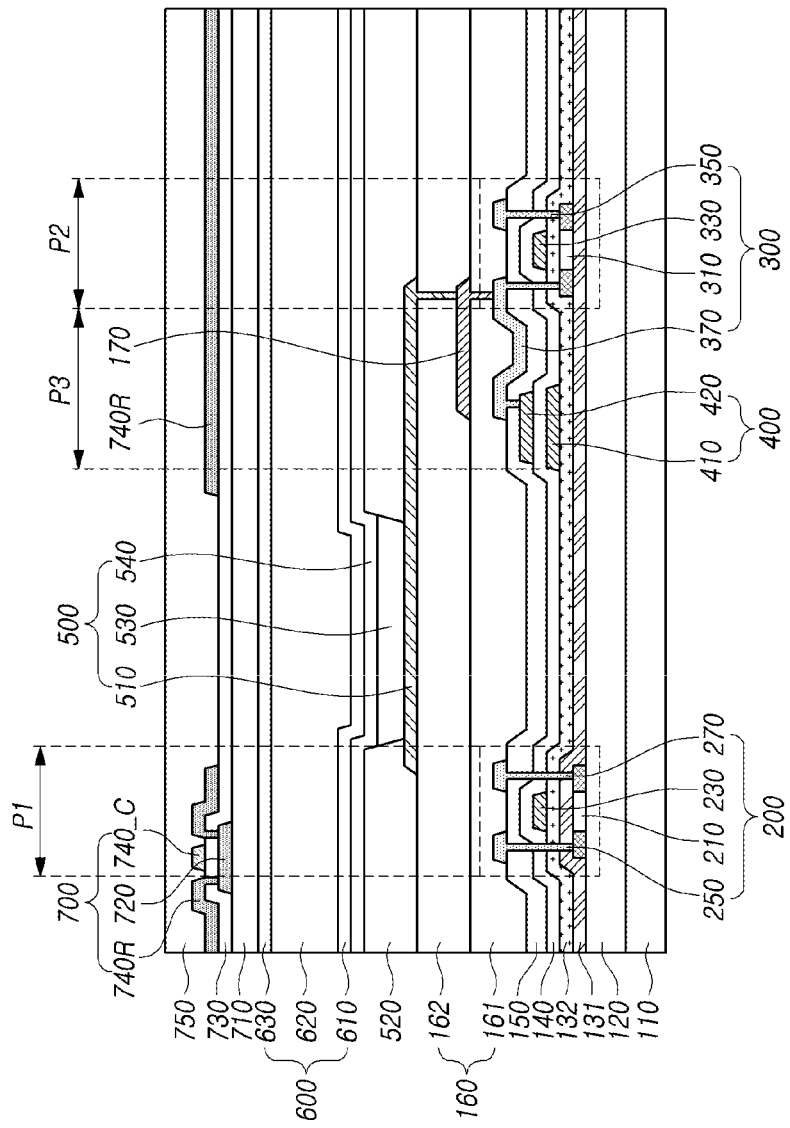
FIG. 5 is a cross-sectional view of a light-emitting display apparatus including a touch sensor layer according to an embodiment of the present disclosure.

FIG. 5 is a cross-sectional view of a light-emitting display apparatus including a touch sensor layer according to an embodiment of the present disclosure.

A light-emitting display apparatus 100 of FIG. 5 is substantially the same as the light-emitting display apparatus of FIG. 4 except for a touch sensor layer 700, and thus duplicate description is omitted.

The touch sensor layer 700 may include a first touch electrode 740_R, a first touch connection electrode 720, a second touch electrode, and a second touch connection electrode 740_C.

A touch buffer layer 710 may be disposed on a protective layer 600. The touch buffer layer 710 may prevent the penetration of a liquid chemical (a developing solution, an etchant or the like) used to manufacture the touch sensor layer 700 or external moisture into the light-emitting element layer 500 including an organic material. In addition, a plurality of touch sensor metals on the touch buffer layer 710 may be prevented from being disconnected due to external impacts, and an interference signal that may occur when the touch sensor layer 700 is driven may be blocked.

The touch buffer layer 710 may be provided in a single layer or multiple layers formed of one of silicon oxide (SiOx), and silicon nitride (SiNx) or an alloy thereof but is not limited thereto. Alternatively, the touch buffer layer 710 may be formed of an organic material such as acrylic resin, epoxy resin, phenolic resin, polyamide resin, polyimide resin, or the like.

The first touch connection electrode 720 may be disposed on the touch buffer layer 710.

For example, the first touch connection electrode 720 may be disposed between first touch electrodes 740_R adjacent to each other in a first direction (or an X-axis direction). The first touch connection electrode 720 may electrically connect first touch electrodes 740_R adjacently disposed and spaced apart from each other in the first direction (or the X-axis direction) but is not limited thereto.

The first touch connection electrode 720 may be disposed to overlap the second touch connection electrode 740_C connecting second touch electrodes adjacent to each other in a second direction (or a Y-axis direction). The first touch connection electrode 720 and the second touch connection electrode 740_C are formed on different layers and thus may be electrically insulated from each other.

A touch insulating layer 730 may be disposed on the touch buffer layer 710 and the first touch connection electrode 720.

The touch insulating layer 730 may include a hole for electrically connecting the first touch electrode 740_R and the first touch connection electrode 720.

The touch insulating layer 730 may electrically insulate the second touch electrode and the second touch connection electrode 740_C from each other.

The touch insulating layer 730 may be a single layer of silicon nitride (SiNx) or silicon oxide (SiOx) or multiple layers including both but is not limited thereto.

The first touch electrode 740_R, the second touch electrode, and the second touch connection electrode 740_C may be disposed on the touch insulating layer 730.

The first touch electrode 740_R and the second touch electrode may be spaced a certain distance from each other. One or more first touch electrodes 740_R adjacent to each other in the first direction (or the X-axis direction) may be formed to be apart from each other. Each of the one or more first touch electrodes 740_R adjacent to each other in the first direction (or the X-axis direction) may be connected to the first touch connection electrode 720 between the first touch electrodes 740_R. For example, each first touch electrode 740_R may be connected to the first touch connection electrode 720 through the hole in the touch insulating layer 730.

Second touch electrodes adjacent to each other in the second direction (or the Y-axis direction) may be connected through the second touch connection electrode 740_C. The second touch electrodes and the second touch connection electrode 740_C may be formed on the same layer. For example, the second touch connection electrode 740_C may be disposed between a plurality of second touch electrodes on the same layer as the second touch electrodes. The second touch connection electrode 740_C may extend from the second touch electrodes.

The first touch electrode 740_R, the second touch electrodes, and the second touch connection electrode 740_C may be formed by the same process.

A touch planarization layer 750 may be disposed on the first touch electrode 740_R, the second touch electrodes, and the second touch connection electrode 740_C.

The touch planarization layer 750 may be disposed to cover the touch insulating layer 730, the first touch electrode 740_R, the second touch electrodes, and the second touch connection electrode 740_C.

The touch planarization layer 750 may be formed of at least one material among organic insulating materials such as benzo cyclobutene (BCB), acrylic resin, epoxy resin, phenolic resin, polyamide resin, or polyimide resin but is not limited thereto.

A touch driving circuit may receive a touch detection signal from the first touch electrode 740_R. In addition, the touch driving circuit may transmit the touch driving signal from the second touch electrode. The touch driving circuit may detect a user's touch using a mutual capacitance between a plurality of first touch electrodes 740_R and the second touch electrodes. For example, when the light-emitting display apparatus 100 is touched, a capacitance between the first touch electrodes 740_R and the second touch electrodes may change. The touch driving circuit may sense such a change in the capacitance and detect coordinates of a touch.

Another embodiment of the present disclosure will be described with reference to FIG. 6 below.

Figure 6:
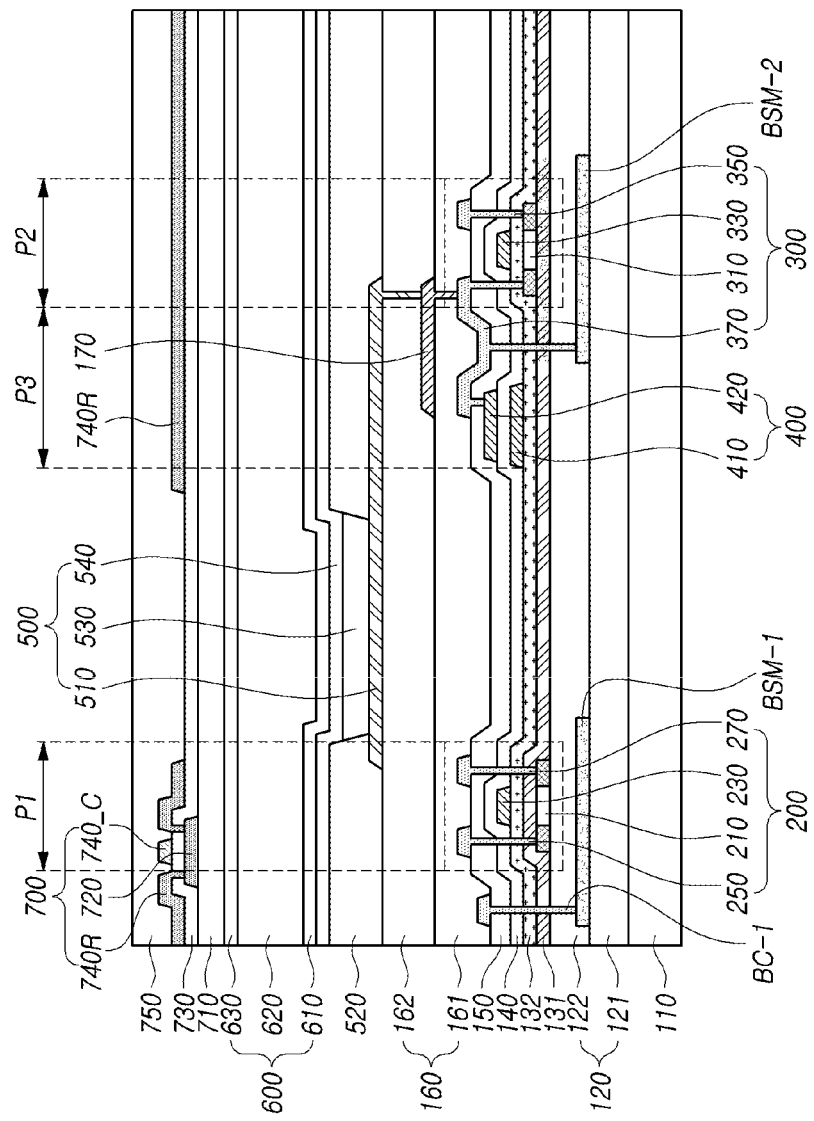
FIG. 6 is a cross-sectional view of a light-emitting display apparatus according to another embodiment of the present disclosure.

FIG. 6 is a cross-sectional view of a light-emitting display apparatus according to another embodiment of the present disclosure.

In FIG. 6, a light-emitting display apparatus 100 is substantially the same as the light-emitting display apparatus 100 of FIG. 4 except for a buffer layer 120, a first blocking layer BSM-1, and a second blocking layer BSM-2, and thus duplicate description is omitted.

The light-emitting display apparatus 100 according to an embodiment of the present disclosure may further include the first blocking layer BSM-1 and the second blocking layer BSM-2.

The first blocking layer BSM-1 and the second blocking layer BSM-2 may be disposed below a first TFT 200 and a second TFT 300, respectively. For example, the first blocking layer BSM-1 may be disposed below a first semiconductor pattern 210 in a first region P1 to overlap the first semiconductor pattern 210. In addition, the second blocking layer BSM-2 may be disposed below a second semiconductor pattern 310 in a second region P2 to overlap the second semiconductor pattern 310.

The first blocking layer BSM-1 may have an area larger than that of the first semiconductor pattern 210, and the second blocking layer BSM-2 may have an area larger than that of the second semiconductor pattern 310.

A blocking layer may prevent light incident from the outside of a light-emitting display apparatus from being emitted to a semiconductor pattern, thereby preventing a malfunction of the semiconductor pattern.

The blocking layer may prevent the inflow of charges from a substrate. For example, when a voltage is applied to a gate electrode of a TFT for a long time, charges may flow from a substrate to a channel region of a semiconductor pattern of the TFT due to an electric field E generated in the TFT, thus resulting in a change of the amount of charges in the channel region. Charges (due to a back channel phenomenon) may be holes or electrons according to the polarity of an electric field. The substrate may cause a current of the TFT to be changed, thus causing a change of a threshold voltage of the TFT. The change of the threshold voltage may lead to a luminance change of a pixel and an afterimage. Therefore, undesired charges may be blocked from flowing from the substrate to the TFT by disposing a blocking layer between the substrate and the semiconductor pattern to prevent a change of a threshold voltage Vth of the TFT, thereby preventing an afterimage and improving display quality.

On a first buffer layer 121, the first blocking layer BSM-1 and the second blocking layer BSM-2 may be disposed in the first region P1 and the second region P2, respectively. Alternatively, on the first buffer layer 121, the first blocking layer BSM-1 in the first region P1 and the second blocking layer BSM-2 in the second region P2 may be disposed on the same layer.

The first blocking layer BSM-1 and the second blocking layer BSM-2 may be disposed using an opaque conductive material to block light incident from the outside of the light-emitting display apparatus. For example, the first blocking layer BSM-1 and the second blocking layer BSM-2 may be provided in a single layer or multiple layers formed of one of molybdenum (Mo), copper (Cu), titanium (Ti), aluminum (Al), chromium (Cr), gold (Au), nickel (Ni), neodymium (Nd), tungsten (W), and gold (Au), or an alloy thereof but are not limited thereto.

The first blocking layer BSM-1 and the second blocking layer BSM-2 may include titanium (Ti) that stably binds with hydrogen. The first blocking layer BSM-1 and the second blocking layer BSM-2 may block the penetration of hydrogen remaining between the substrate and an insulating film into the semiconductor pattern due to a process of forming the semiconductor pattern. Therefore, because the first blocking layer BSM-1 and the second blocking layer BSM-2 prevent the semiconductor pattern from becoming conductive, the reliability of operating characteristics of the TFT of the light-emitting display apparatus according to an embodiment of the present disclosure may be improved.

The first blocking layer BSM-1 may be electrically connected to a blocking layer connection pattern BC-1.

The blocking layer connection pattern BC-1 may be provided with a constant voltage from the outside. Therefore, the first blocking layer BSM-1 may be maintained at the same voltage as the blocking layer connection pattern BC-1, thus reducing a change of characteristics of elements around the first blocking layer BSM-1. That is, the first blocking layer BSM-1 is affected less by an external voltage and thus may prevent a change of the threshold voltage Vth of the first TFT 200 due to the back channel phenomenon.

The second blocking layer BML2 may be electrically connected to a second drain electrode 370 of a second TFT 300. For example, when the light-emitting display apparatus is driven, the second blocking layer BSM-2 may be maintained at the same voltage as the second drain electrode 370 and thus a change of characteristics of elements around the second blocking layer BSM-2 may decrease. That is, the second blocking layer BSM-2 is affected less by an external voltage and thus may prevent a change of the threshold voltage Vth of the second TFT 300 due to the back channel phenomenon.

A second buffer layer 122 may be disposed on the first blocking layer BSM-1 and the second blocking layer BSM-2.

Another embodiment of the present disclosure will be described with reference to FIG. 7 below.

Figure 7:
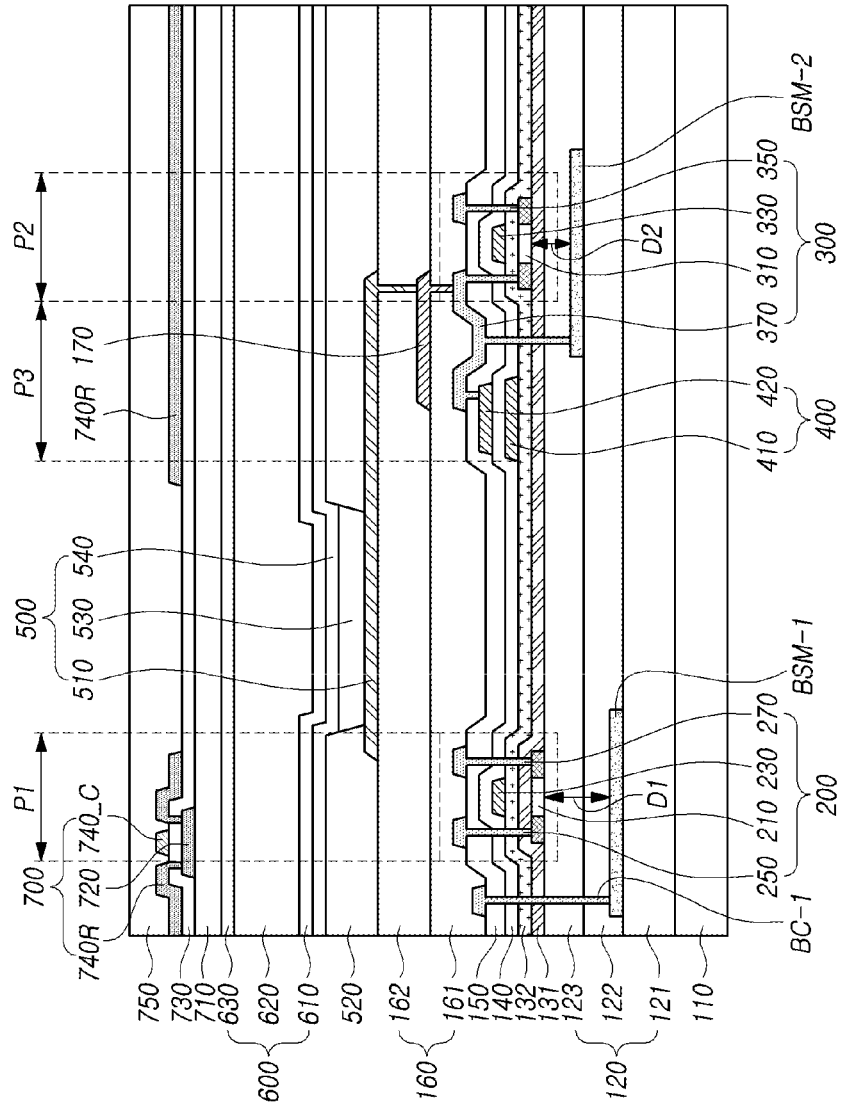
FIG. 7 is a cross-sectional view of a light-emitting display apparatus according to another embodiment of the present disclosure.

FIG. 7 is a cross-sectional view of a light-emitting display apparatus according to another embodiment of the present disclosure.

In FIG. 7, a light-emitting display apparatus 100 is substantially the same as the light-emitting display apparatus 100 of FIG. 5 except for a layer on which a first blocking layer BSM-1 and a second blocking layer BSM-2 are disposed, and thus duplicate description is omitted.

In the case of a TFT using an oxide semiconductor pattern as a semiconductor pattern, a variation in a current relative to a variation in a unit voltage is large according to characteristics of a material of the oxide semiconductor and thus a defect is likely to occur in a low gradation area requiring precise control of current. Therefore, in an embodiment of the present disclosure, a driving TFT in which a variation in a current in a semiconductor pattern relative to a variation in a voltage applied to a gate electrode is relatively small (insensitive) may be provided.

The first blocking layer BSM-1 in a first region P1 and the second blocking layer BSM-2 in a second region P2 may be located on different layers. For example, a first semiconductor pattern 210 of a first TFT 200 and the first blocking layer BSM-1 may be spaced a first vertical distance D1 from each other. A second semiconductor pattern 310 of a second TFT 300 and the second blocking layer BSM-2 may be spaced a second vertical distance D2 from each other. The second vertical distance D2 may be less than the first vertical distance D1.

At least one buffer layer may be disposed between the first blocking layer BSM-1 and the second blocking layer BSM-2. In addition, the first blocking layer BSM-1 may be disposed at a lower position of the second blocking layer BSM-2.

The buffer layer 120 may include a first buffer layer 121, a second buffer layer 122, and a third buffer layer 123. The first buffer layer 121, the second buffer layer 122, and the third buffer layer 123 may be arranged sequentially.

The first blocking layer BSM-1 may be disposed on the first buffer layer 121 in the first region P1. The second buffer layer 122 may be disposed on the first buffer layer 121 and the first blocking layer BSM-1. The second blocking layer BSM-2 may be disposed on the second buffer layer 122 in a second region. In addition, the third buffer layer 123 may be disposed on the second buffer layer 122 and the second blocking layer BSM-2.

A number of buffer layers between the first semiconductor pattern 210 and the first blocking layer BSM-1 is at least one more than a number of buffer layers between the second semiconductor pattern 310 and the second blocking layer BSM-2. For example, as shown in FIG. 7, two buffer layers 122, 123 are between the first semiconductor pattern 210 and the first blocking layer BSM-1, and one buffer layer 123 is between the second semiconductor pattern 310 and the second blocking layer BSM-2.

Forming low gradation of a TFT according to a vertical distance according to an embodiment of the present disclosure will be described with reference to FIGS. 8A and 8B below.

Figure 8A:
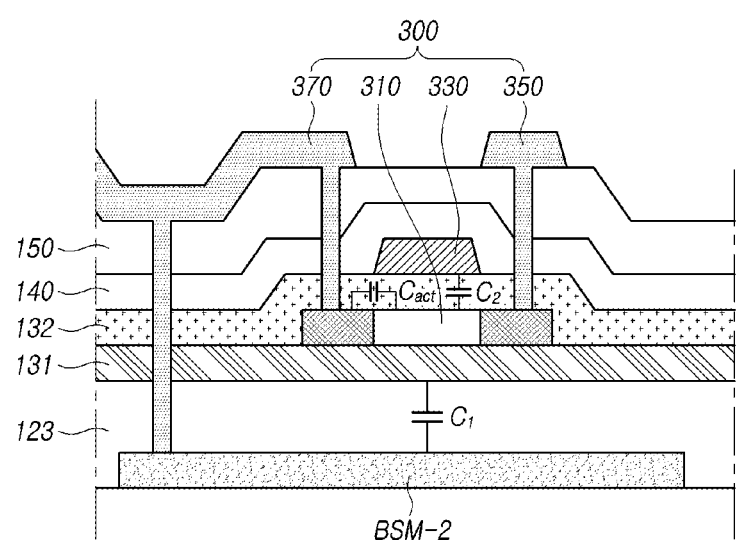
FIG. 8A is a cross-sectional view of a second thin-film transistor (TFT) of FIG. 7 according to another embodiment of the present disclosure.
Figure 8B:
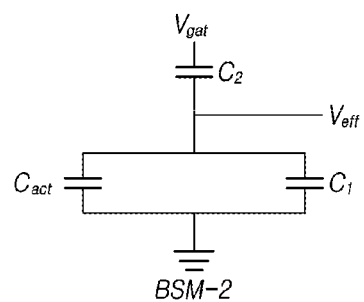
FIG. 8B is a circuit diagram illustrating a relationship between parasitic capacitors present in the second TFT of FIG. 8A.

FIG. 8A is a cross-sectional view of a second TFT according to another embodiment of the present disclosure. FIG. 8B is a circuit diagram illustrating a relationship between parasitic capacitors generated in the second TFT of FIG. 8A.

A certain voltage may be applied to the second blocking layer BSM-2. The voltage applied to the second blocking layer BSM-2 may be different from a voltage applied to the second gate electrode 330. For example, the second blocking layer BSM-2 may be electrically connected to the second drain electrode 370. A constant voltage may be applied to the second blocking layer BSM-2 regardless of the voltage applied to the second gate electrode 330. Thus, a parasitic capacitance having a first capacitance C1 may be formed between the second blocking layer BSM-2 and the second semiconductor pattern 310. A parasitic capacitance having a second capacitance C2 may be formed between the second semiconductor pattern 310 and the second gate electrode 330.

As a second source region and a second drain region of an end of the second semiconductor pattern 310 are doped with impurities, a parasitic capacitance having a third capacitance $C_{ACT}$ may be formed in the second semiconductor pattern 310 when a voltage is applied to the second semiconductor pattern 310.

In a light-emitting display apparatus according to an embodiment of the present disclosure, a variation in an effective gate voltage affecting a driving current to be supplied to a light-emitting element layer 500 may be determined according to the following equation.

$$\Delta V_{eff} = \frac{C2}{C2 + C_{ACT} + C1} \times \Delta V_{GAT} \qquad \text{[Equation 1]}$$

$\Delta V_{eff}$ denotes a variation in the effective gate voltage (or an effective voltage), and may be understood as a voltage to be actually applied to a channel of the second semiconductor pattern 310. $\Delta V_{GAT}$ denotes a variation in a voltage applied to the second gate electrode 330.

Referring to [Equation 1], generation of a driving current may be affected by adjusting a first parasitic capacitance C1 formed between the second blocking layer BSM-2 and the second semiconductor pattern 310. For example, an effective voltage A $V_{eff}$ applied to the channel of the second semiconductor pattern 310 is inversely proportional to the first parasitic capacitance C1 and thus an effective voltage to be applied to an oxide semiconductor pattern may be controlled by adjusting the first parasitic capacitance C1.

$$C = Q/V = \varepsilon_o A/d \qquad \text{[Equation 2]}$$

($\varepsilon_o$: dielectric constant, A: area, d: distance between electrodes)

Referring to [Equation 2], a capacitance increases as the distance between electrodes decreases. Therefore, a variation $\Delta V_{eff}$ in a voltage to be applied to the second semiconductor pattern 310 may be reduced by increasing the first parasitic capacitance C1 by arranging the second blocking layer BSM-2 to be close to the second semiconductor pattern 310.

A reduction in a variation Δ in an effective current flowing through the second semiconductor pattern 310 may be understood to mean that a range of controlling the second TFT 300 using a variation $\Delta V_{GAT}$ in a voltage applied to the second gate electrode 330 increases.

Thus, a second vertical distance D2 between the second semiconductor pattern 310 of the second TFT 300 and the second blocking layer BSM-2 may be formed to be less than a first vertical distance D1 between the first semiconductor pattern 210 of the first TFT 200 and the first blocking layer BSM-1, thereby increasing a range of controlling gradation using the second TFT 300. Accordingly, a light-emitting element layer may be accurately controlled even at low gradation, thereby preventing screen blurring frequently occurring at low gradation.

Another embodiment of the present disclosure will be described with reference to FIG. 9 below.

Figure 9:
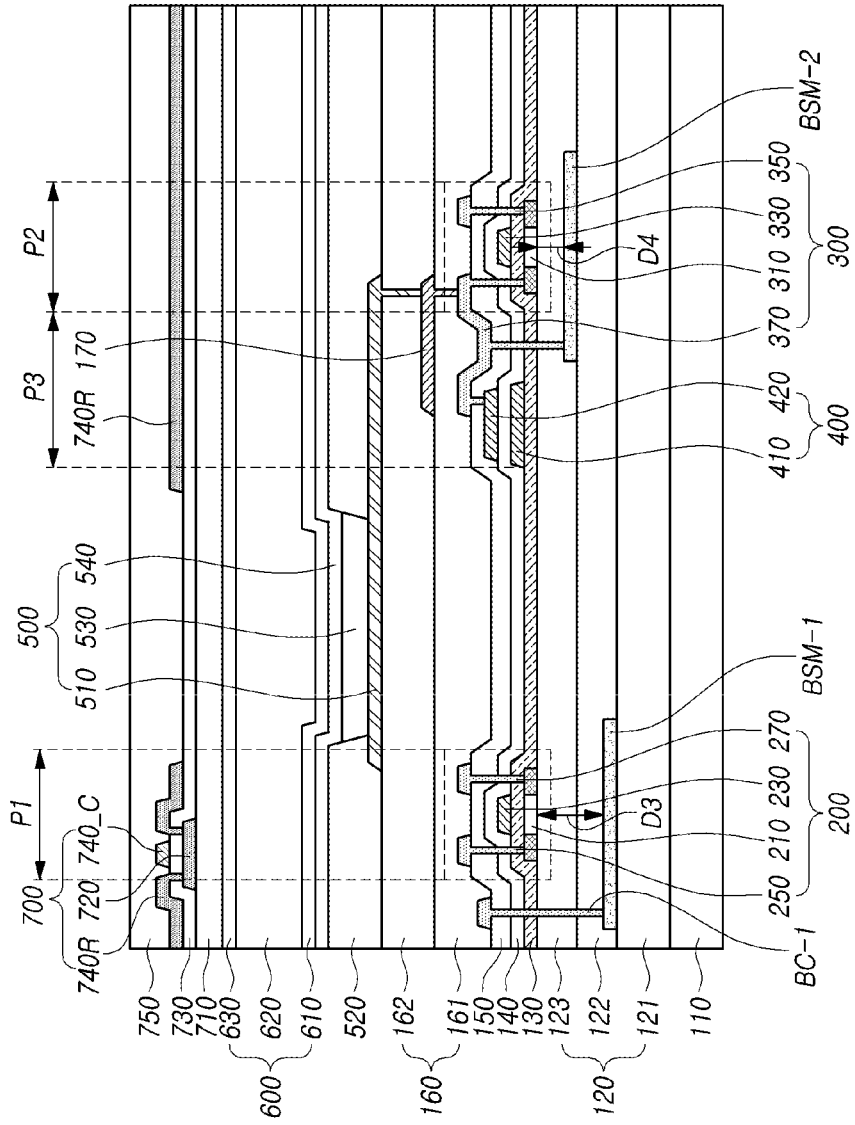
FIG. 9 is a cross-sectional view of a light-emitting display apparatus according to another embodiment of the present disclosure.

FIG. 9 is a cross-sectional view of a light-emitting display apparatus according to another embodiment of the present disclosure.

The light-emitting display apparatus of FIG. 9 is substantially the same as that of FIG. 7 except that a first semiconductor pattern 210 and a second semiconductor pattern 310 are disposed on the same layer, and thus duplicate description is omitted.

The first semiconductor pattern 210 and the second semiconductor pattern 310 may be disposed on the same layer.

A buffer layer 120 may be disposed on a substrate 110. The buffer layer 120 may include a first buffer layer 121, a second buffer layer 122, and a third buffer layer 123. The first buffer layer 121, the second buffer layer 122, and the third buffer layer 123 may be arranged sequentially.

A first blocking layer BSM-1 may be disposed on the first buffer layer 121 in a first region P1. The second buffer layer 122 may be disposed on the first buffer layer 121 and the first blocking layer BSM-1. A second blocking layer BSM-2 may be disposed on the second buffer layer 122 in a second region. The third buffer layer 123 may be disposed on the second buffer layer 122 and the second blocking layer BSM-2.

On the buffer layer 120 or the third buffer layer 123, the first semiconductor pattern 210 of the first TFT 200 may be disposed in the first region P1 and the second semiconductor pattern 310 of the second TFT 300 may be disposed in the second region. An insulating layer 130 may be disposed on the first semiconductor pattern 210 and the second semiconductor pattern 310.

The first blocking layer BSM-1 in the first region P1 and the second blocking layer BSM-2 in the second region may be located on different layers. For example, the first semiconductor pattern 210 of the first TFT 200 and the first blocking layer BSM-1 may be spaced a third vertical distance D3 from each other. The second semiconductor pattern 310 of the second TFT 300 and the second blocking layer BSM-2 may be spaced a fourth vertical distance D4 from each other. The fourth vertical distance D4 may be less than the third vertical distance D3.

A parasitic capacitance may be generated between the second semiconductor pattern 310 and the second blocking layer BSM-2. As described above with reference to FIGS. 7, 8A, and 8B, when the second TFT 300 is formed of an oxide semiconductor, a capacitance increases as the distance between electrodes decreases. Therefore, a range of controlling gradation by the second TFT 300 may be increased by increasing a parasitic capacitance by arranging the second blocking layer BSM-2 to be close to the second semiconductor pattern 310. Accordingly, a light-emitting element layer may be accurately controlled even at low gradation, thereby preventing screen blurring frequently occurring at low gradation.

A display apparatus according to an embodiment of the present disclosure will be described below.

A light-emitting display apparatus according to an embodiment of the present disclosure may include a substrate including a first region and a second region, a first TFT disposed in the first region of the substrate and including a first semiconductor pattern, a first gate electrode, a first source electrode, and a first drain electrode, a second TFT disposed in the second region of the substrate and including a second semiconductor pattern, a second gate electrode, a second source electrode, and a second drain electrode, at least one insulating layer between the first semiconductor pattern and the second semiconductor pattern, a first blocking layer below the first semiconductor pattern, and a second blocking layer below the second semiconductor pattern.

According to some embodiments of the present disclosure, the first blocking layer may at least partially overlap the first semiconductor pattern, and the second blocking layer may at least partially overlap the second semiconductor pattern.

According to some embodiments of the present disclosure, a vertical distance between the second semiconductor pattern and the second blocking layer may be less than that between the first semiconductor pattern and the first blocking layer.

According to some embodiments of the present disclosure, a buffer layer between the first semiconductor pattern and the first blocking layer may further include at least one more buffer layer than a buffer layer between the second semiconductor pattern and the second blocking layer.

According to some embodiments of the present disclosure, the first gate electrode and the second gate electrode may be disposed on the same layer, and the first source electrode, the first drain electrode, the second source electrode, and the second drain electrode may be disposed on the same layer.

According to some embodiments of the present disclosure, the second blocking layer may be electrically connected to the second drain electrode and a light-emitting element layer.

According to some embodiments of the present disclosure, the second blocking layer may be electrically connected to a storage capacitor.

According to some embodiments of the present disclosure, the first semiconductor pattern may be a polycrystalline semiconductor pattern, and the second semiconductor pattern may be an oxide semiconductor pattern.

According to some embodiments of the present disclosure, the first semiconductor pattern and the second semiconductor pattern may be oxide semiconductor patterns.

According to some embodiments of the present disclosure, a lower side of the insulating layer may be in contact with the first semiconductor pattern and an upper side of the insulating layer may be in contact with a lower side of the second semiconductor pattern.

According to some embodiments of the present disclosure, a touch sensor layer may be further disposed on the substrate.

According to some embodiments of the present disclosure, the touch sensor layer may include a first touch connection electrode, a touch insulating layer on the first touch connection electrode, and a first touch electrode and a second touch electrode on the touch insulating layer.

According to some embodiments of the present disclosure, a variation in a mutual capacitance cm between the first touch electrode and the second touch electrode may be detected to detect whether there is a touch and sense a touched location.

According to some embodiments of the present disclosure, the first semiconductor pattern and the second semiconductor pattern may be oxide semiconductor patterns.

A light-emitting display apparatus according to another embodiment of the present disclosure may include a substrate including a first region and a second region, a first TFT disposed in the first region of the substrate and including a first semiconductor pattern, a first gate electrode, a first source electrode, and a first drain electrode, a second TFT disposed in the second region of the substrate and including a second semiconductor pattern, a second gate electrode, a second source electrode, and a second drain electrode, a first blocking layer below the first semiconductor pattern, and a second blocking layer below the second semiconductor pattern.

According to some embodiments of the present disclosure, the first semiconductor pattern and the second semiconductor pattern may be disposed on the same layer, the first gate electrode and the second gate electrode may be disposed on the same layer, and the first source electrode, the first drain electrode, the second source electrode, and the second drain electrode may be disposed on the same layer.

According to some embodiments of the present disclosure, the first blocking layer may at least partially overlap the first semiconductor pattern, and the second blocking layer may at least partially overlap the second semiconductor pattern.

According to some embodiments of the present disclosure, a vertical distance between the second semiconductor pattern and the second blocking layer may be less than that between the first semiconductor pattern and the first blocking layer.

According to some embodiments of the present disclosure, a buffer layer between the first semiconductor pattern and the first blocking layer may include at least one more buffer layer than a buffer layer between the second semiconductor pattern and the second blocking layer.

According to some embodiments of the present disclosure, the second blocking layer may be electrically connected to the second drain electrode and a light-emitting element layer.

According to some embodiments of the present disclosure, the second blocking layer may be electrically connected to a storage capacitor.

According to some embodiments of the present disclosure, the first semiconductor pattern may be a polycrystalline semiconductor pattern, and the second semiconductor pattern may be an oxide semiconductor pattern.

According to some embodiments of the present disclosure, the first semiconductor pattern and the second semiconductor pattern may be oxide semiconductor patterns.

According to some embodiments of the present disclosure, a touch sensor layer may further be disposed on the substrate.

According to some embodiments of the present disclosure, the touch sensor layer may include a first touch connection electrode, a touch insulating layer on the first touch connection electrode, and a first touch electrode and a second touch electrode on the touch insulating layer.

According to some embodiments of the present disclosure, a variation in a mutual capacitance Cm between the first touch electrode and the second touch electrode may be detected to detect whether there is a touch and sense a touched location. Although the embodiments of the present disclosure have been described above in more detail with reference to the accompanying drawings, the present disclosure is not necessarily limited thereto and may be implemented in many different forms without departing from the technical scope of the present disclosure. Therefore, the embodiments set forth herein are not intended to limit the technical scope of the present disclosure but are provided to describe the technical scope of the present disclosure, and thus the technical scope of the present disclosure is not limited by the embodiments. Therefore, it should be understood that the embodiments described above are merely examples in all respects and not restrictive. The scope of the present disclosure should be interpreted based on the claims, and it should be understood that all technical ideas equivalent thereto fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitting display apparatus, comprising:
a flexible substrate including a first region and a second region;
a first thin-film transistor disposed in the first region of the flexible substrate, and including a first semiconductor layer, a first gate electrode, a first source electrode, and a first drain electrode;
a second thin-film transistor disposed in the second region of the flexible substrate, and including a second semiconductor layer, a second gate electrode, a second source electrode, and a second drain electrode;
at least one insulating layer between the first semiconductor layer and the second semiconductor layer;
a first blocking layer below the first semiconductor layer;
a second blocking layer below the second semiconductor layer;
a light-emitting element layer on the first thin-film transistor and the second thin-film transistor; and
a color filter disposed on the light-emitting element layer;
wherein a vertical distance between the second semiconductor layer and the second blocking layer is different from a vertical distance between the first semiconductor layer and the first blocking layer.

2. The light-emitting display apparatus of claim 1, further comprising a planarization layer disposed on the first source electrode, the first drain electrode, the second source electrode, and the second drain electrode,
wherein the planarization layer includes a first planarization layer and a second planarization layer.

3. The light-emitting display apparatus of claim 2,
further comprising a connection electrode is disposed between the first planarization layer and the second planarization layer,
wherein the connection electrode is electrically connected to the second thin-film transistor.

4. The light-emitting display apparatus of claim 1, wherein the first blocking layer at least partially overlaps the first semiconductor layer, and the second blocking layer at least partially overlaps the second semiconductor layer.

5. The light-emitting display apparatus of claim 1, wherein the number of the insulating layer is at least two.

6. The light-emitting display apparatus of claim 1, wherein a number of buffer layers between the first semiconductor layer and the first blocking layer is at least one more than a number of buffer layers between the second semiconductor layer and the second blocking layer.

7. The light-emitting display apparatus of claim 1, wherein the first gate electrode and the second gate electrode are disposed on the same layer as each other, and the first source electrode, the first drain electrode, the second source electrode, and the second drain electrode are disposed on the same layer as each other.

8. The light-emitting display apparatus of claim 1, wherein the second blocking layer is electrically connected to the second drain electrode and the light-emitting element layer.

9. The light-emitting display apparatus of claim 1, wherein the second blocking layer is electrically connected to a storage capacitor.

10. The light-emitting display apparatus of claim 1, wherein the first semiconductor layer comprises a polycrystalline semiconductor layer, and the second semiconductor layer comprises an oxide semiconductor layer.

11. The light-emitting display apparatus of claim 1, wherein the first semiconductor layer and the second semiconductor layer are oxide semiconductor layers.

12. The light-emitting display apparatus of claim 1, wherein a lower side of the at least one insulating layer is in contact with the first semiconductor layer and an upper side of the at least one insulating layer is in contact with a lower side of the second semiconductor layer.

13. The light-emitting display apparatus of claim 1, further comprising a protective layer disposed on the light-emitting element layer.

14. The light-emitting display apparatus of claim 13, further comprising a touch sensor layer on the protective layer.

15. The light-emitting display apparatus of claim 14, wherein the touch sensor layer comprises a first touch connection electrode, a touch insulating layer on the first touch connection electrode, and a first touch electrode and a second touch electrode on the touch insulating layer.

16. The light-emitting display apparatus of claim 15, wherein a variation in a mutual capacitance between the first touch electrode and the second touch electrode is detected to sense whether there is a touch and to sense a touched location.

17. The light-emitting display apparatus of claim 1, wherein the first gate electrode and the second gate electrode are disposed on the same layer, and
the first source electrode and the first drain electrode are disposed on a different layer than the second source electrode and the second drain electrode.

18. The light-emitting display apparatus of claim 1, wherein a number of insulating layers between the first source electrode and the first gate electrode is at least one more than a number of insulating layers between the second source electrode and the second gate electrode.

* * * * *